United States Patent [19]
Ohkuni et al.

[11] Patent Number: 5,404,079
[45] Date of Patent: Apr. 4, 1995

[54] PLASMA GENERATING APPARATUS

[75] Inventors: Mitsuhiro Ohkuni; Masafumi Kubota, both of Osaka; Noboru Nomura, Kyoto; Ichiro Nakayama, Osaka; Tokuhiko Tamaki, Osaka, all of Japan

[73] Assignee: Matsushita Electric Industrial Co., Ltd., Kadoma, Japan

[21] Appl. No.: 97,230

[22] Filed: Jul. 27, 1993

[30] Foreign Application Priority Data

Aug. 13, 1992 [JP] Japan .................. 4-215820

[51] Int. Cl.$^6$ .............................. H01J 7/24
[52] U.S. Cl. .................. 315/111.81; 315/111.21; 315/111.31; 315/111.71; 361/230; 361/235
[58] Field of Search ............ 315/111.21, 111.31, 315/111.71, 111.81; 361/230, 235

[56] References Cited

U.S. PATENT DOCUMENTS 5,272,417  12/1993  Ohmi ........................... 315/111.21
5,273,609  12/1993  Moslehi ..................... 315/111.21 X

FOREIGN PATENT DOCUMENTS 3-30424  2/1991  Japan .

Primary Examiner—Robert J. Pascal
Assistant Examiner—Reginald A. Ratliff
Attorney, Agent, or Firm—Willian Brinks Hofer Gilson & Lione

[57] ABSTRACT

On the inner surface of a chamber are circumferentially disposed three lateral electrodes at regular intervals. To the lateral electrodes are applied three high-frequency electric powers of 50 MHz, each differing in phase by approximately 120°. On the bottom of the chamber is placed a sample stage serving as a second electrode, around which is provided a ring-shaped earth electrode. To the sample stage is applied high-frequency electric power of 13.56 MHz. The distance between each of the three lateral electrodes and the earth electrode is longer than the distance between the sample stage and the earth electrode.

8 Claims, 14 Drawing Sheets

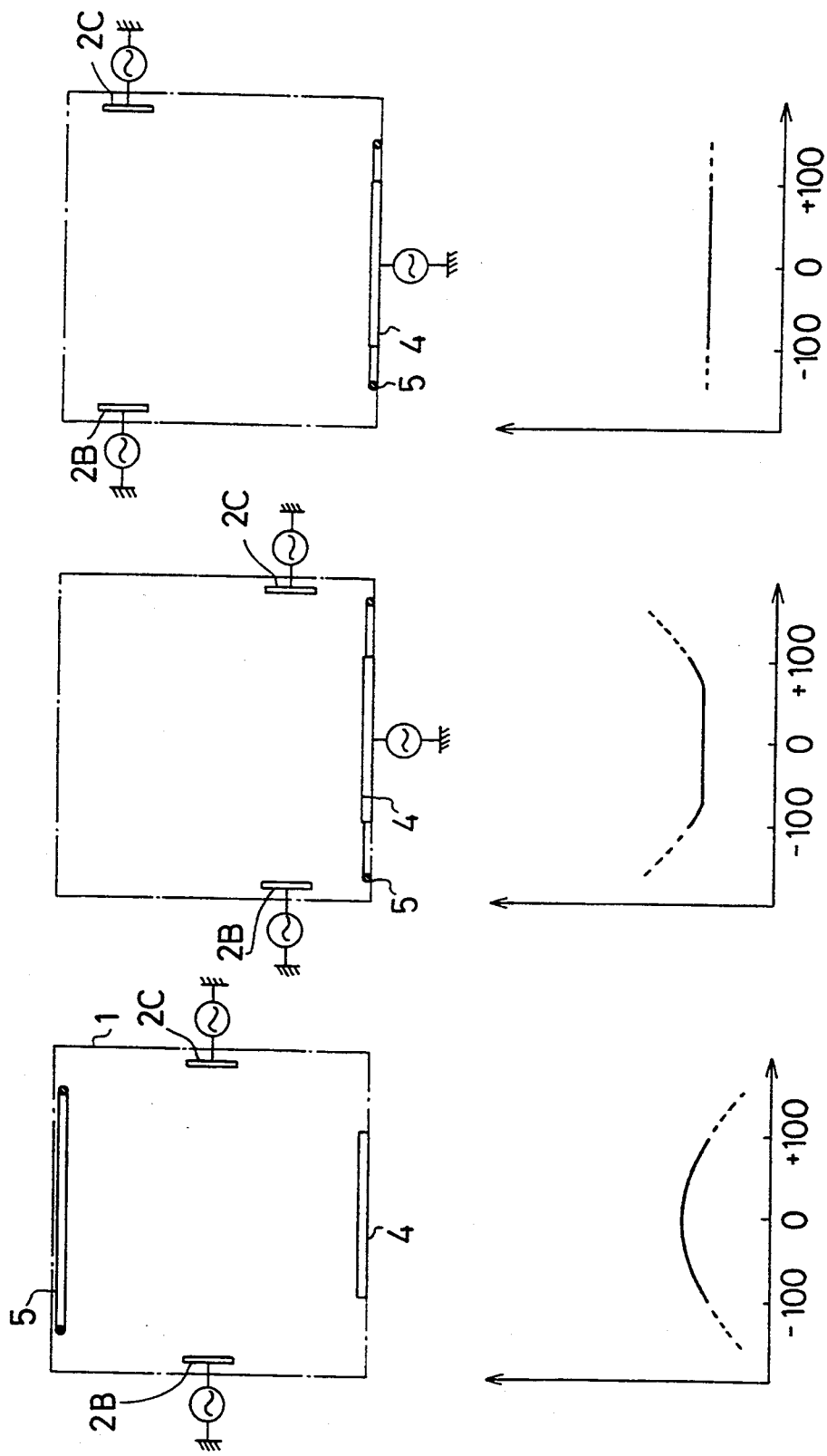

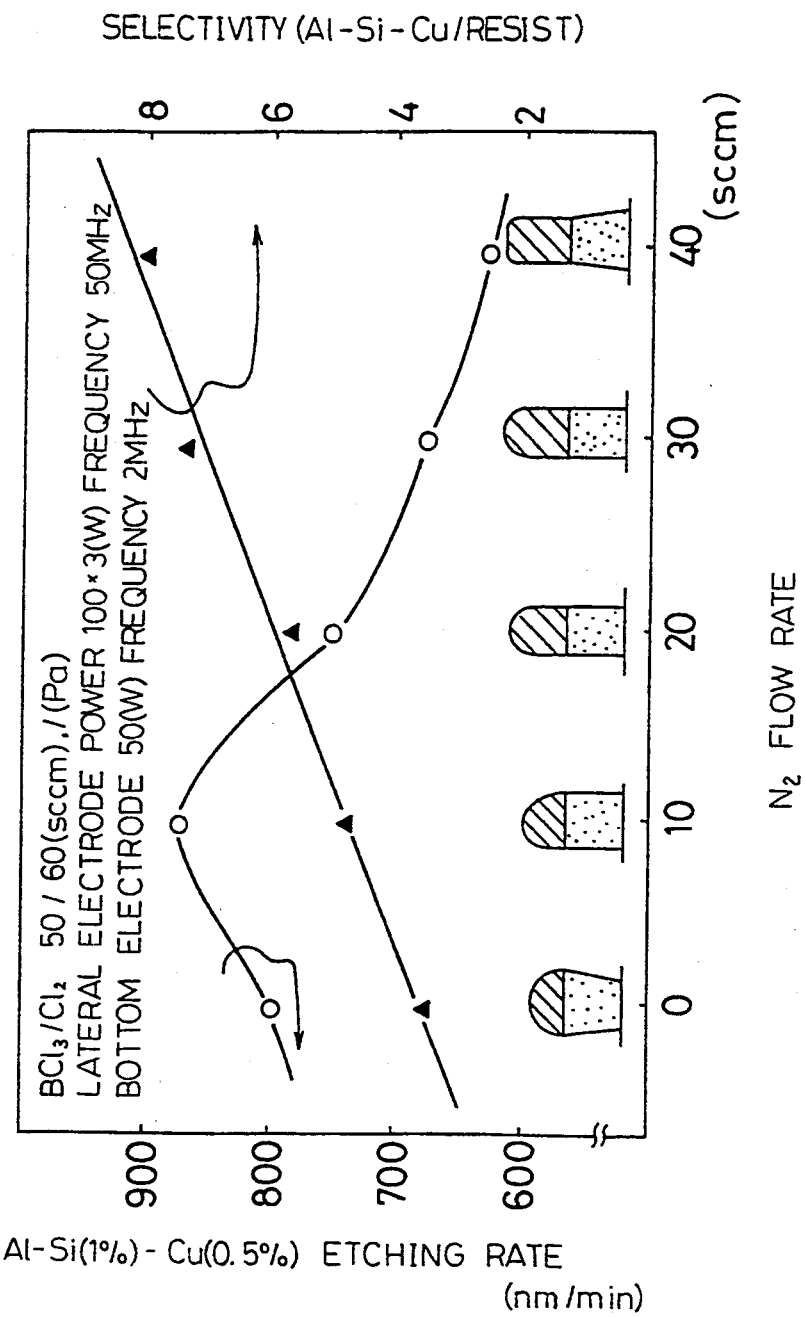

5,404,079

PLASMA GENERATING APPARATUS

BACKGROUND OF THE INVENTION

The present invention relates to a plasma generating apparatus using a high-frequency electric discharge.

A plasma generating method using a high-frequency electric discharge is used in various fields such as dry etching for microprocessing, sputtering and plasma CVD for forming thin films, and an ion implantation apparatus. In such a method, it is required to generate a plasma under high, vacuum in order to provide extremely fine features and to control film quality with high precision.

Below, a dry-etching technique suitable for microprocessing will be described as an exemplary application of the plasma generating method.

The recent progress in the field of highly dense semiconductor integrated circuits is bringing about changes comparable to those brought about by the Industrial Revolution. Higher densities have been attained in semiconductor integrated circuits by reducing element dimensions, improving devices, providing chips with larger areas, and the like. Element dimensions have been reduced to the extent of the wavelength of light. In lithography, the use of excimer laser or x-rays is promising. In forming micropatterns, dry etching as well as lithography are playing important roles.

Dry etching is a processing technique for removing unnecessary portions of a thin film or substrate by utilizing a chemical or physical reaction at the interface between a solid phase and a gas phase of radicals, ions and the like, which are present in a plasma. Reactive ion etching (RIE) is most widely used among dry-etching techniques. According to RIE, a sample is exposed to a plasma of an appropriate gas, which has been generated by a high-frequency electric discharge, so that the resultant etching reaction removes unnecessary portions of the sample on its surface. The necessary portions that should not be removed are generally protected by a photoresist pattern serving as a mask.

In microprocessing, it is required for ions to move in the same direction, and for this purpose, it is indispensable to reduce the scattering of the ions in the plasma. To equalize the direction of ionic movements, it is effective to increase the mean free path of the ions by reducing the pressure in a plasma generating apparatus. However, this causes a problem that a high-frequency electric discharge hardly occurs under high vacuum in a plasma chamber.

In view of the foregoing, there have been developed magnetron RIE, ECR dry etching, and like techniques which facilitate the generation of an electric discharge by applying a magnetic field to a plasma chamber.

FIG. 13 is a view diagrammatically showing a conventional ion-etching apparatus using a magnetron discharge. In a metallic chamber 51 is introduced a reactive gas via a gas controller 52. The pressure in the chamber 51 is controlled at an appropriate value by an exhaust system 53. In the upper part of the chamber 51 is provided an anode 54. In the lower part of the chamber 51 is provided a sample stage 55 serving as a cathode. The sample stage 55 is connected to a RF power supply 57 via an impedance-matching circuit 56 so that a high-frequency electric discharge is generated between the sample stage 55 and the anode 54. On the side parts of the chamber 51 are provided two pairs of AC electromagnets 58, each of which differs in phase by 90°. A rotating magnetic field is applied into the chamber 51 by the two pairs of AT electromagnets 58, thereby facilitating the generation of an electric discharge under high vacuum. This causes the cycloid movement of electrons, which lengthens the path traveled by an electron, resulting in higher ionization efficiency.

FIG. 14(a) shows an embodiment in which boron phosphorus glass is etched by a conventional magnetron RIE or ECR dry-etching apparatus. In the drawing, 60 designates a Si substrate, 61 designates the boron phosphorus glass, and 62 designates a photoresist pattern.

However, such a conventional apparatus as mentioned above is disadvantageous in that a device may be damaged as will be described below. With the conventional magnetron RIE apparatus, the rotating magnetic field dissolves the uneven distribution of a plasma to be averaged with the passage of time. However, since the momentary strength of the magnetic field differs radially in the chamber, as shown in FIG. 14(b), the plasma density differs accordingly from one place to another, so that non-uniform etching may be performed or potential difference may be caused locally. When the conventional magnetron RIE apparatus is applied to a MOSLSI process, therefore, the gate oxide film may be destroyed disadvantageously.

Similarly in the ECR apparatus, the momentary strength of the magnetic field generally differs in the radial direction of the chamber, so that non-uniform etching may be performed or potential difference may be caused locally due to the uneven density of the plasma, which is disadvantageous.

In view of the foregoing, Japanese Patent Application No. 2-402319 proposes a plasma generating apparatus comprising: a vacuum chamber; plasma generating means including N first electrodes (N is an integer not less than 2) which are disposed at roughly regular intervals in the vacuum chamber and a first high-frequency power supply for supplying said first electrodes in the order of their arrangement with high-frequency electric powers, each of which has a first frequency but differs in phase by (360/N) degrees, so as to generate, by means of a rotating electric field formed by said first electrodes, a highly dense plasma in a plasma generating part surrounded by said first electrodes; and ion extracting means including a second electrode, an earth electrode, both of which are disposed in said vacuum chamber, and a second high-frequency power supply for supplying said second electrode with high-frequency electric power having a second frequency so as to extract ions from the plasma which has been generated in said plasma generating part.

Though this plasma generating apparatus can generate a highly dense and uniform plasma under high vacuum, an object of the present invention is to provide a plasma generating apparatus which can generate a more uniform plasma, which is suitable for microprocessing, and which minimizes damage to a device.

SUMMARY OF THE INVENTION

In order to achieve the object mentioned above, the plasma generating apparatus according to the present invention comprises: a vacuum chamber; plasma generating means including N first electrodes (N is an integer not less than 2) disposed at roughly regular intervals in said vacuum chamber and a first high-frequency power supply for supplying said first electrodes in the order of their arrangement with high-frequency electric powers, each of which has a first frequency but differs in phase by (360/N) degrees, so as generate, by means of a rotating electric field formed by said first electrodes, a highly dense plasma in a plasma generating part surrounded by said first electrodes; and ion extracting means including a second electrode, an earth electrode, both of which are disposed in said vacuum chamber, and a second high-frequency power supply for supplying said second electrode with high-frequency electric power having a second frequency so as to extract ions from the plasma which has been generated in said plasma generating part, said earth electrode being placed in such a position that an electric field formed between said earth electrode and said second electrode does not interfere with the rotating electric field formed by said first electrodes.

Consequently, the rotating electric field formed by the first electrodes of the plasma generating means induces electrons to rotate or move in such a manner as to draw Lissajous's figures including the cycloid, so that high ionization efficiency is obtained irrespective of a high vacuum, resulting in the generation of a highly dense plasma in the plasma generating part. Compared with a conventional apparatus using a magnetic field to cause a magnetron discharge or ECR discharge, the apparatus of the present invention uses a uniform electric field in order to generate a highly uniform plasma, so that it is easy to provide the apparatus in a larger scale. Moreover, since the plasma is hardly localized, damage to the object being processed is minimized.

The earth electrode of the ion extracting means is placed in a position in which the electric field formed between the earth electrode and the second electrode does not interfere with the rotating electric field formed by the first electrodes, thus preventing the phenomenon that a highly dense plasma generated by the rotating electric field formed by the first electrodes is disturbed by the electric field formed between the second electrode and the earth electrode.

Hence, the plasma generating apparatus of the present invention is excellent in microprocessing, so that damage to a device is minimized.

In the plasma generating apparatus according to the present invention, said first electrodes are preferably placed on the lateral part of said vacuum chamber and said second electrode is preferably placed on the bottom of said vacuum chamber.

This can surely prevent the phenomenon that a highly dense plasma generated by the rotating electric field formed by the first electrodes is disturbed by the electric field formed between the second electrode and the earth electrode.

In the plasma generating apparatus according to the present invention, said earth electrode is preferably formed in the shape of a ring and provided around said second electrode.

This can more surely prevent the phenomenon that a highly dense plasma generated by the rotating electric field formed by the first electrodes is disturbed by the electric field formed between the second electrode and the earth electrode.

In the plasma generating apparatus according to the present invention, the distance between each of said first electrodes and said earth electrode is preferably longer than the distance between said second electrode and said earth electrode.

Thus, the plasma is not generated between the first electrodes and the earth electrode, so that the generation of the plasma is limited between the second electrode and the earth electrode. Considering the fact that the earth electrode is placed in a position in which the electric field formed between the second electrode and the earth electrode does not interfere with the rotating electric field formed by the first electrodes, the plasma generated between the second electrode and the earth electrode is not disturbed by the plasma generated between the first electrodes and the earth electrode, so that the plasma generated in the plasma generating part becomes more uniform.

In the plasma generating apparatus according to the present invention, the first frequency of the high-frequency electric powers applied to said first electrodes is preferably set higher than the second frequency of the high-frequency electric power applied to said second electrode.

This reduces the radius of the rotation of an electron in the plasma, so that a plasma with higher density is generated by the rotating electric field formed by the first electrodes. Since the first frequency is set higher than the second frequency, electrons as well as ions follow the electric field formed between the second electrode and the earth electrode, thus preventing the phenomenon that the direction of ionic movements is disturbed by the electrons accompanying ions. Consequently, anisotropic etching can surely be performed.

In the plasma generating apparatus according to the present invention, the inner surface of said vacuum chamber is preferably insulated.

Thus, the inner surface of the vacuum chamber is negatively charged with respect to the plasma potential, so that the loss in plasma is reduced. Consequently, the plasma is generated efficiently under high vacuum.

In the plasma generating apparatus according to the present invention, the surfaces of said first electrodes are preferably covered with insulating protective films for preventing sputter deposition on said first electrodes.

This prevents sputter deposition on the first electrodes. Consequently, the first electrodes are not deteriorated by sputtering during the generation of the plasma and the vacuum chamber along with the device being processed is not contaminated with impurities. Since the protective film is insulating, the efficiency of the secondary electron discharge from the first electrodes is increased, so that the plasma density is further increased.

In the plasma generating apparatus according to the present invention, the pressure in said vacuum chamber is preferably set at 10 Pa or less.

This shortens the distance traveled freely by an electron, so that the plasma density is increased.

BRIEF DESCRIPTION OF THE DRAWINGS

FIGS. 5(a) to 5(c) show electron densities which were measured by changing the position of an earth electrode in the foregoing dry-etching apparatus of the first embodiment:

FIG. 5(a) shows the electron density which was measured when the earth electrode was placed in the upper part of the chamber; FIG. 5(b) shows the electron density which was measured when the earth electrode was placed roughly midway between lateral electrodes and a sample stage; and FIG. 5(c) shows the electron density which was measured when the distance between the lateral electrodes and the earth electrode was greater than the distance between the sample stage and the earth electrode;

FIG. 6(a) shows the case in which the first frequency is higher than the second frequency; and FIG. 6(b) shows the case in which the first frequency is lower than the second frequency;

FIG. 7(a) shows the polysilicon film prior to dry etching; and FIG. 7(b) shows the polysilicon film after dry etching;

FIG. 9(a) shows the aluminum-silicon film prior to dry etching; and FIG. 9(b) shows the aluminum-silicon film after dry etching;

FIG. 10 shows the dependence of etching properties on the $N_2$ gas flow rate when the aluminum-silicon film is etched by using the dry-etching apparatus according to the foregoing first embodiment;

FIG. 11(a) shows the BPSG film prior to dry etching; and FIG. 11(b) shows the BPSG film after dry etching;

DETAILED DESCRIPTION OF THE PREFERRED EMBODIMENT

Figure 1:
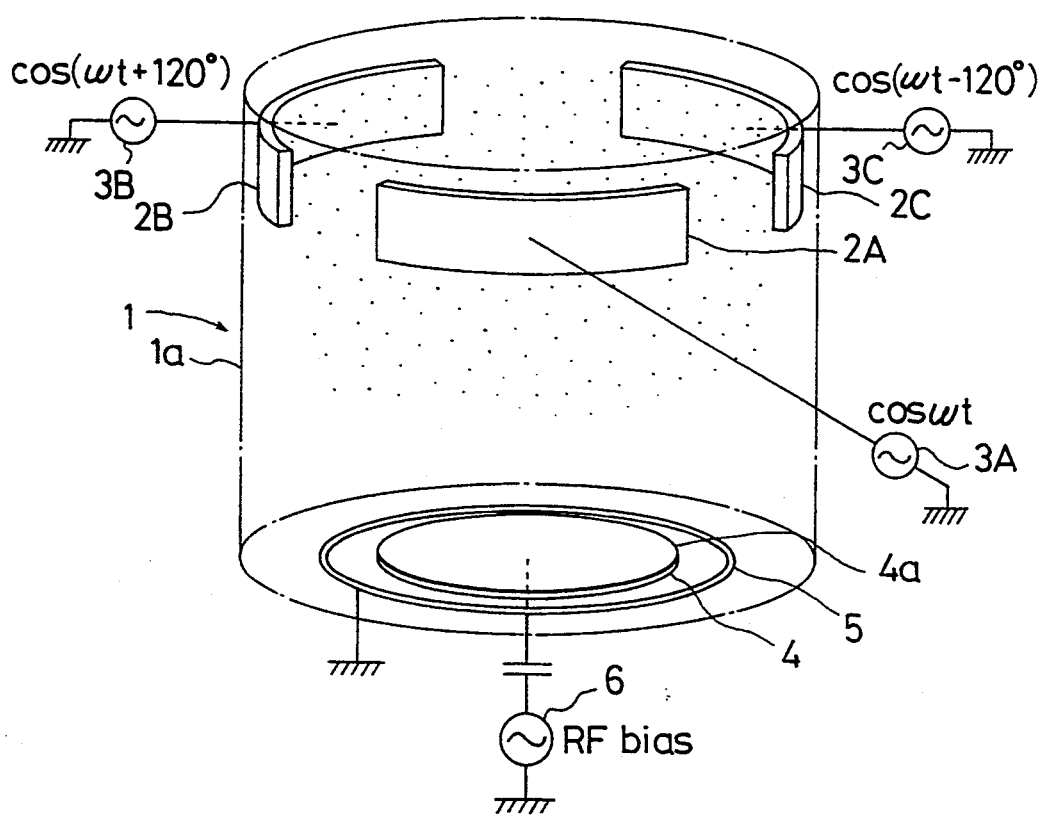
FIG. 1 is a view diagrammatically showing a dry-etching apparatus as a first embodiment of the plasma generating apparatus according to the present invention.

Referring now to the drawings, embodiments of the present invention will be described below.

Figure 2:
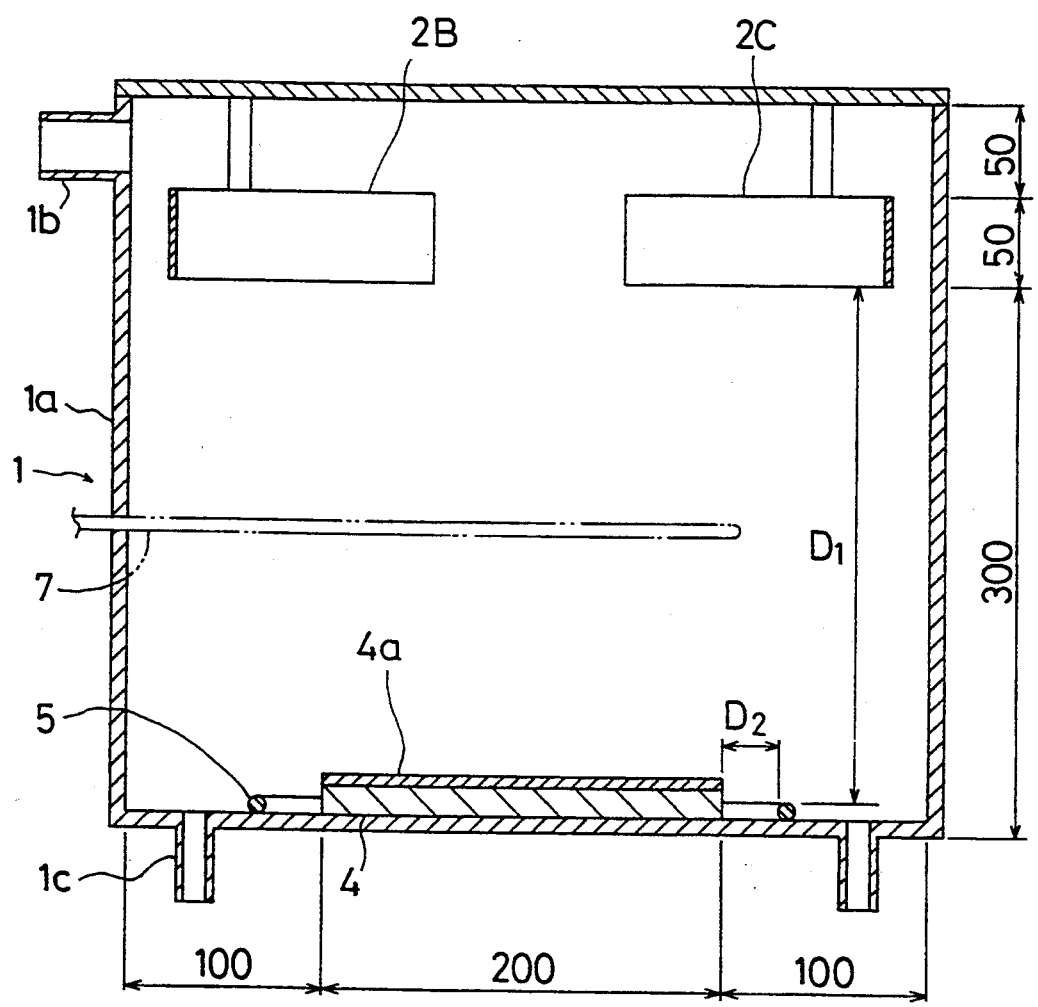
FIG. 2 is a longitudinal sectional view of the foregoing dry-etching apparatus of the first embodiment.
Figure 3:
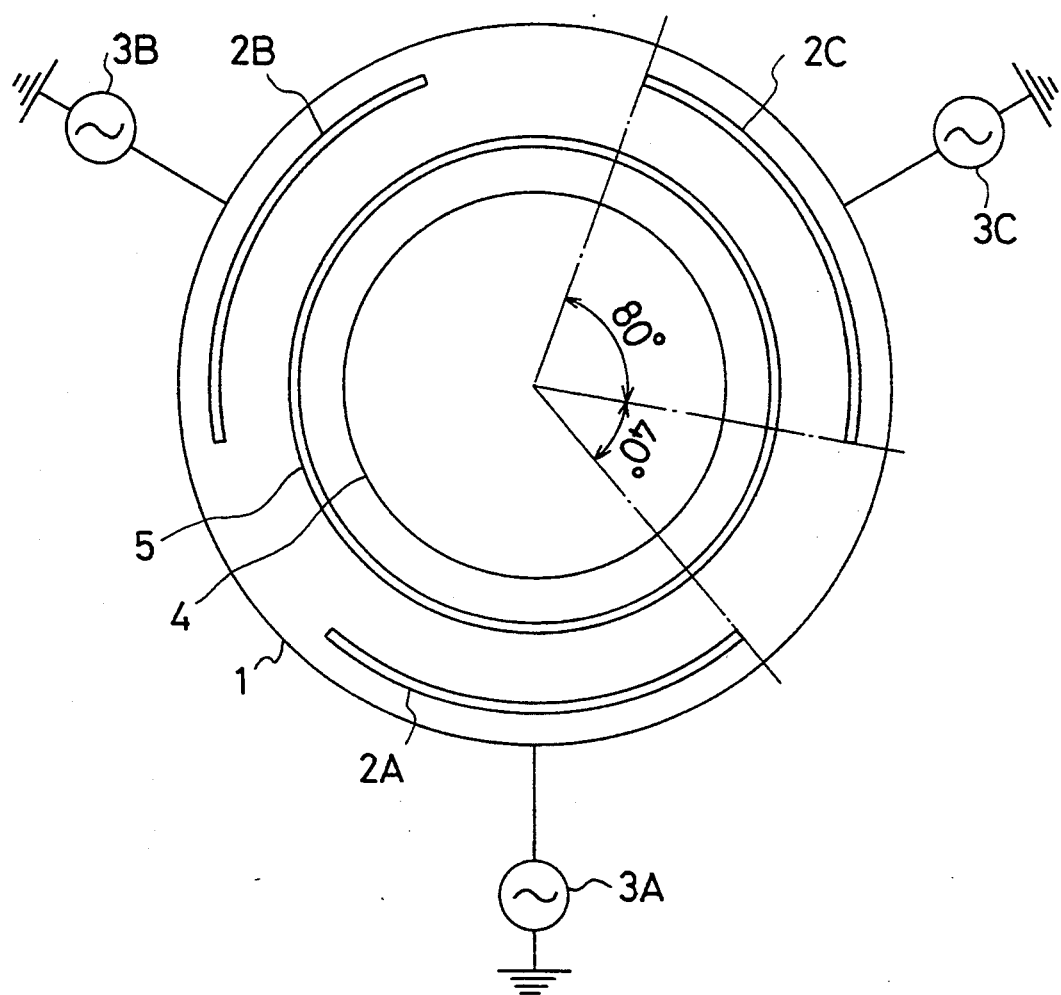
FIG. 3 is a transverse sectional view of the foregoing dry-etching apparatus of the first embodiment.

FIG. 1 shows the structure of a dry-etching apparatus as a first embodiment of the plasma generating apparatus according to the present invention, wherein N is 3. FIG. 2 shows a longitudinal cross section of the foregoing dry-etching apparatus. FIG. 3 shows a transverse cross section of the foregoing dry-etching apparatus. In the drawings, 1 designates an earthed chamber, the inner surface of which is covered with an insulator such as ceramic, teflon, or quartz. The inside of the chamber 1 constitutes a vacuum chamber. Instead of covering the inner surface 1a of the chamber 1 with an insulator, it is also possible to provide the inside of the chamber 1 with a separate inner chamber made of quartz or the like.

The inner surface 1a of the chamber 1 is provided with three lateral electrodes 2A, 2B, and 2C serving as first electrodes, which are circumferentially placed at roughly regular intervals, so that each lateral electrode and its adjacent interval occupy an angular position of 120°. To the lateral electrodes 2A, 2B, and 2C are applied high-frequency electric powers having a first frequency, each of which has the same discharging electric power but differs in phase by 120°. That is, the phase of the lateral electrode 2B is 120° ahead of the phase of the lateral electrode 2A, while the phase of the lateral electrode 2C is 120° behind the phase of the lateral electrode 2A. Although high-frequency electric powers ranging from 15 MHz to 300 MHz is applied to each of the lateral electrodes 2A, 2B, and 2C via a matching circuit (not shown), electric power having the frequency of 50 MHz is applied to each of the lateral 2A, 2B, and 2C in the present embodiment. Moreover, a phase shift of 120° is realized by a phase shifter (not shown) between each adjacent two of the high-frequency electric powers which are supplied to the lateral electrodes 2A, 2B, and 2C, respectively.

The foregoing high-frequency power supplies 3A, 3B, and 3C and three lateral electrodes 2A, 2B, and 2C constitute a plasma generating means. A rotating electric field, which is formed by the high-frequency electric powers applied to the lateral electrodes 2A, 2B, and 2C, generates a highly dense plasma in the plasma generating part surrounded by the lateral electrodes 2A, 2B, and 2C. In this case, it is not necessary to earth the lateral electrodes 2A, 2B, and 2C, for each lateral electrode serves as the earth for another lateral electrode because of the phase shift provided between each adjacent two of the high-frequency electric powers which are applied to the lateral electrodes 2A, 2B, and 2C.

On the bottom of the chamber 1 is placed a sample stage 4 serving as a second electrode. Around the sample stage 4 is provided a ring-shaped earth electrode 5. To the sample stage 4 is applied high-frequency electric power with a second frequency of 13.56 MHz, for example, from a second high-frequency poser supply 6.

The first embodiment uses the cylindrical chamber 1 with a diameter of 400 mm and with a height of 400 mm. Each of the lateral electrodes 2A, 2B, and 2C is 50 mm in height and the sample stage 4 is 200 mm in diameter. The distance $L_1$ from each of the lateral electrodes 2A, 2B, and 2C to the earth electrode 4 is 200 mm, while the distance $L_2$ from the sample stage 4 to the earth electrode 4 is 30 mm.

An etchant gas is introduced through an inlet 1b via a gas-flow controller (not shown) into the chamber 1, which is then exhausted through an outlet 1c to the outside. The pressure in the chamber 1 is controlled in the range of 0.1 to 10 Pa by a turbopump (not shown).

Figure 4:
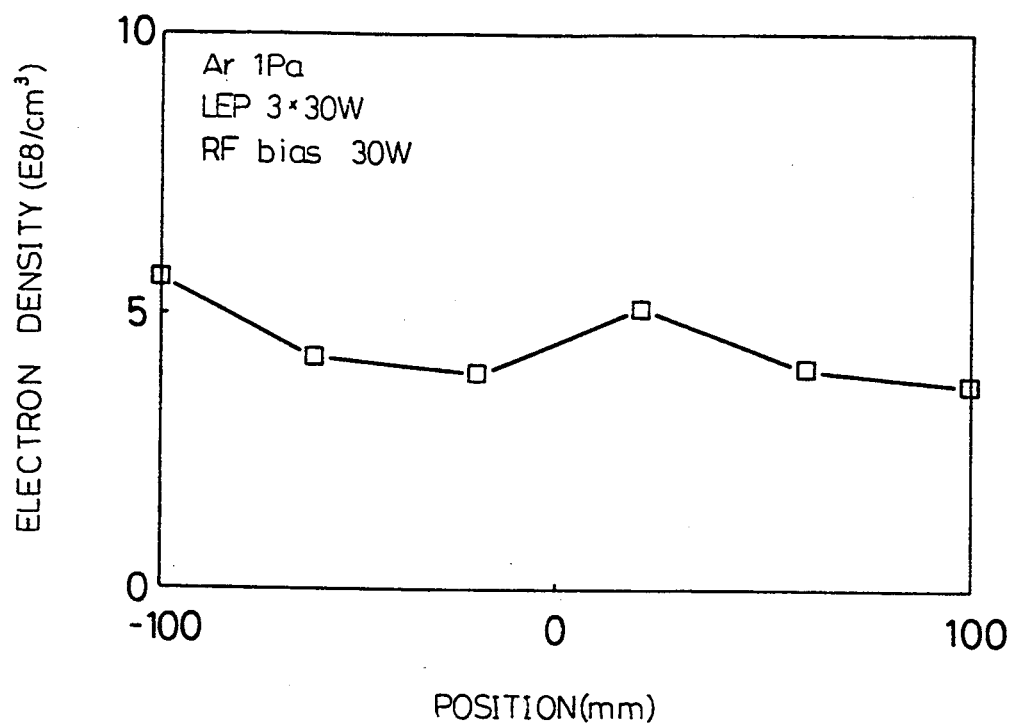
FIG. 4 is a view showing electron densities which were measured by the Langmuir probe method in the foregoing dry-etching apparatus of the first embodiment.

FIG. 4 shows electron densities which were measured by the Langmuir probe method in the foregoing etching apparatus. The measurements were conducted in a region lying below the plasma generating part surrounded by the three lateral electrodes 2A, 2B, and 2C.

Ar gas was used as the etchant gas, and the pressure in the chamber 1 was 1 Pa. To the lateral electrodes 2A, 2B, and 2C were applied high-frequency electric powers of 30 W, each of which has the same frequency of 50 MHz but differs in phase by 120°. To the sample stage 4, on which a sample 4a is placed, was applied high-frequency electric power of 30 W having the frequency of 13.56 MHz. A probe 7 is horizontally inserted into the chamber 1 at a height midway between the lateral electrodes 2A, 2B, and 2C and the sample stage 4. The electron densities were measured at points within the horizontal range extending −100 mm to +100 mm from the center of the sample stage 4.

As shown in FIG. 4, a highly uniform plasma was generated under high vacuum of 1 Pa, without applying a magnetic field, due to the confinement effect exerted on electrons by the rotating electric field. The plasma uniformity is greatly affected by the degree of vacuum. Under high vacuum of 10 Pa or more, the plasma is localized in the vicinity of the lateral electrodes 2A, 2B, and 2C, so that the degree of plasma uniformity is slightly lowered.

FIGS. 5(a) to 5(c) show the electron densities measured at points within the horizontal range extending −100 mm to +100 mm from the center of the sample stage 4. The measurements were conducted by changing the position of the earth electrode 5: FIG. 5(a) shows the case where the earth electrode 5 is positioned in the upper part of the chamber 1; FIG. 5(b) shows the case where the earth electrode 5 is positioned roughly midway between each of the lateral electrodes 2A, 2B, and 2C and the sample stage 4; and FIG. 5(c) shows the case where the distance $D_1$ from each of the lateral electrodes 2A, 2B, and 2C to the earth electrode 5 is 200 mm and the distance $D_2$ from the sample stage 4 to the earth electrode 5 is 30 mm.

In the case shown in FIG. 5., the electric field formed between the sample stage 4 and the earth electrode 5 interferes with the rotating electric field formed by the lateral electrodes 2A, 2B, and 2C, so that the plasma generated by the lateral electrodes 2A, 2B, and 2C is disturbed, resulting in the non-uniform density of the plasma. This is because the plasma is generated by a strong electric discharge occurring between each of the lateral electrodes 2A, 2B, and 2C and the earth electrode 5 and that the electric discharge occurring between the sample stage 4 and the earth electrode 5 is weakened. In the case shown in FIG. 5(b), though the overall plasma density is more uniform than in the case of FIG. 5(a), the plasma density in the marginal portion of the sample stage 4 is not uniform. This is because electric discharges of the same magnitude occurred both between each of the lateral electrodes 2A, 2B, and 2C and the earth electrode 5 and between the sample stage 4 and the earth electrode 5, so that the plasma was generated on both sides. In the case shown in FIG. 5(c), on the contrary, the plasma density is uniform even in the marginal portion of the sample stage 4. This is because an electric discharge did not occur between each of the lateral electrodes 2A, 2B, and 2C and the earth electrode 5, so that the plasma was not generated.

The following will consider the relationship between the first frequency $f_1$ of the high-frequency electric power applied to each of the lateral electrodes 2A, 2B, and 2C and the second frequency $f_2$ of the high-frequency electric power applied to the sample stage 4.

In the first embodiment, high-frequency power having the frequency of 50 MHz is applied to each of the lateral electrodes 2A, 2B, and 2C, while high-frequency power having the frequency of 13.56 MHz is applied to the sample stage 4. When the frequency of the high-frequency electric power applied to the sample stage 4 was changed to 50 MHz, the degree of plasma uniformity is lowered. When the frequency of the high-frequency electric power was changed to 70 MHz, the dependence of the plasma density on the power of the sample stage 4 is increased, so that it was difficult to control ionic energy and plasma density independently.

By setting the first frequency $f_1$ higher than the second frequency $f_2$, the rotating electric field formed by the lateral electrodes 2A, 2B, and 2C is used to generate the plasma, while the electric field formed between the sample stage 4 and the earth electrode 5 is used to extract ions from the plasma generated in the plasma generating part. In general, the amount of energy an electron obtains in a high-frequency electric field is inversely proportional to its mass. Since the mass of an ion is several thousand times larger than that of an electron, ions cannot follow an high-frequency electric field of 10 MHz or more and only electrons can follow the high-frequency electric field. By setting the first frequency $f_1$ at 10 MHz or more, which is higher than the second frequency $f_2$, only electrons can follow the rotating electric field formed by the lateral electrodes 2A, B, and 2C, so that the first frequency $f_1$ can be used exclusively for generating the plasma. Moreover, by setting the second frequency $f_2$ lower than the first frequency $f_1$, preferably at 10 MHz or less, ionic energy incident upon the sample stage 4 can be controlled by the high-frequency electric power with the second frequency $f_2$.

Figure 6A:
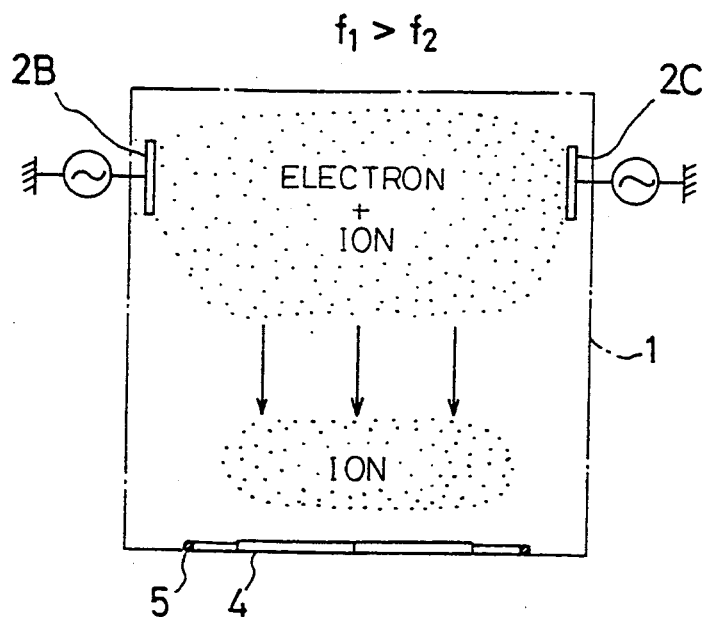
FIGS. 6(a) and 6(b) show the relationship between the ordering of first and second frequencies and the state of the generated plasma.
Figure 6B:
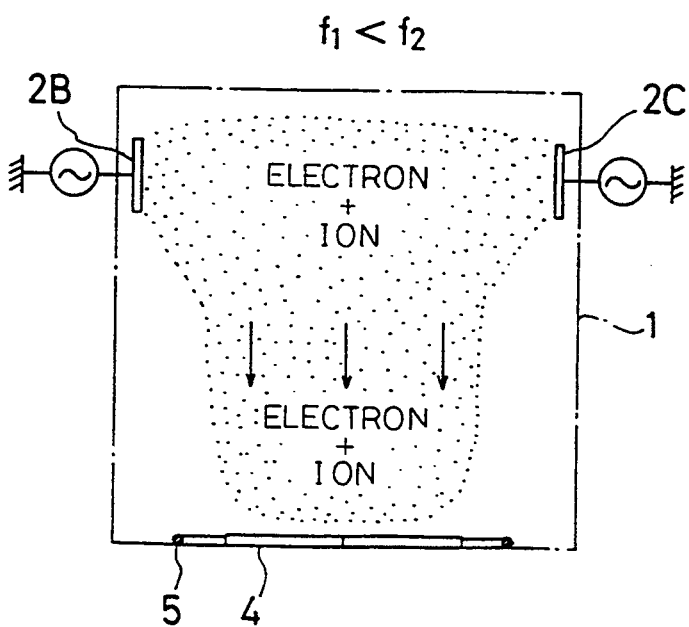

FIG. 6(a) shows the case where the first frequency $f_1$ is higher than the second frequency $f_2$ and FIG. 6(b) shows the case where the first frequency $f_1$ is lower than the second frequency $f_2$, In the case shown in FIG. 6(a), the direction of ionic movements is not disturbed by electrons, for the electrons in the plasma generating part do not follow the electric field formed between the sample stage 4 and the earth electrode 5. In the case shown in FIG. 6(b), however, the electrons as well as ions in the plasma generating part follow the electric field formed between the sample stage 4 and the earth electrode 5, so that the direction of ionic movements is disturbed by the electrons accompanying the ions. Consequently, it is possible to independently control the plasma generated in the plasma generating part and the ions extracted from the plasma in the case of FIG. 6(a), while it is difficult to independently control the plasma generated in the plasma generating part and the ions extracted from the plasma in the case of 6(b).

The following will consider the insulation of the inner surface 1a of the chamber 1.

In the first embodiment, the inner surface 1a of the chamber 1 was covered with an insulator such as ceramic, teflon, or quartz. In addition to the case mentioned above, another case was also examined in which the inner surface 1a of the chamber 1 is not covered and composed of metal. In this case, an electric discharge occurs between each of the lateral electrodes 2A, 2B, and 2C and the uncovered inner surface 1a of the chamber 1, which unstabilizes the electric discharge among the lateral electrodes 2A, 2B, and 2C, so that the plasma density obtained was one half or less of the plasma density obtained when the inner surface 1a was covered with an insulator.

In the first embodiment, the surfaces of the lateral electrodes 2A, 2B, and 2C and the surface of the sample stage 4 are covered with protective films made of alumina, because it is experimentally proved that coverage with alumina makes the plasma density 10 to 30% higher than that obtained when the surfaces are not covered and composed of metal. Moreover, if the lateral electrodes 2A, 2B, and 2C are covered with an insulating protective film, sputtering against the lateral electrodes 2A, 2B, and 2C does not occur, so that metal contamination resulting from sputtering can be prevented in the chamber 1.

The following will describe the results of dry etching which was performed by using the dry-etching apparatus according to the first embodiment.

Figure 7A:
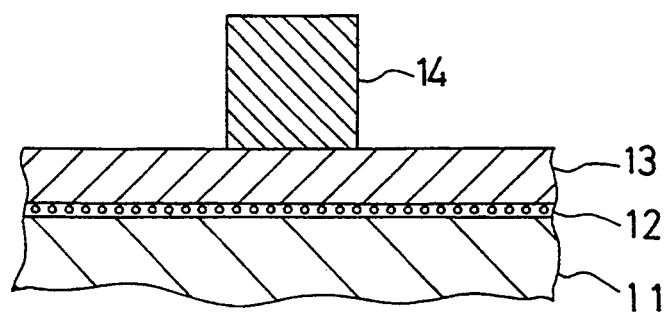
FIGS. 7(a) and 7(b) show a polysilicon film which is etched by using the dry-etching apparatus according to the foregoing first embodiment.
Figure 7B:
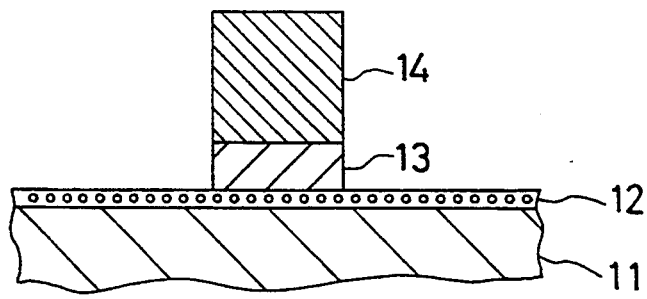

First, etching for a polysilicon film will be described with reference to FIGS. 7. The film structure is shown in FIG. 7(a), in which thermally grown $SiO_2$ 12, n+Poly-Si film 13, and a resist 14 are successively deposited on a silicon substrate 11. The etching conditions are as follows: the flow rate of the etchant gas $Cl_2$ is 80 sccm; the degree of vacuum is 1 Pa; the frequency of the high-frequency electric power to be applied to the sample stage 4 is 13.56 MHz; the high-frequency electric power applied to the sample stage 4 is 30 W; the frequency of the high-frequency electric power to be applied to each of the lateral electrodes 2A, 2B, and 2C is 50 MHz; and the electric power to be applied to each of the lateral electrodes 2A, 2B, and 2C is changed to 30 W, 40 W, 50 W, 60 W, and 70 W. Dry etching was conducted under the etching conditions mentioned above, with the result that the vertical etch profile was satisfactorily obtained under all the power conditions.

Figure 8:
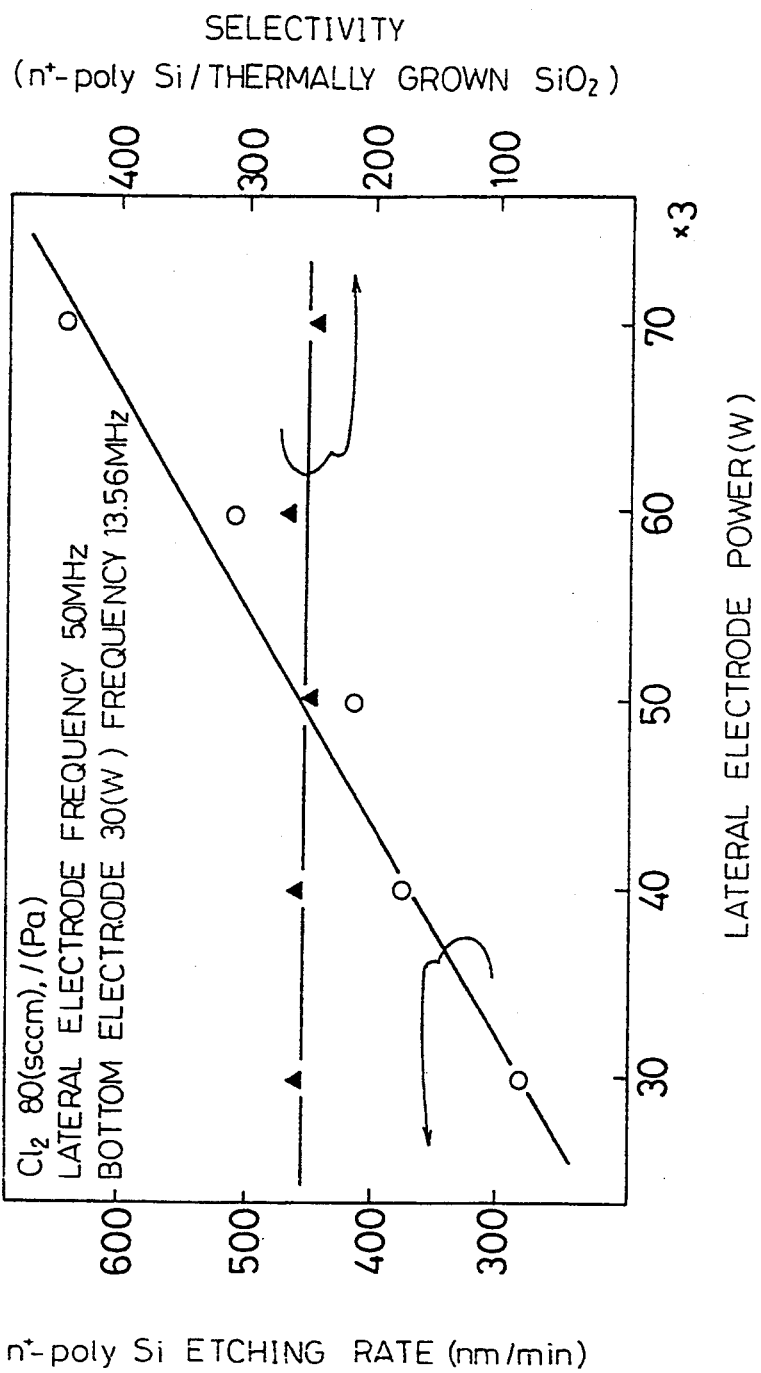
FIG. 8 shows the dependence of etching properties on the power of a lateral electrode when the polysilicon film is etched by using the dry-etching apparatus according to the foregoing first embodiment.

FIG. 8 shows the dependence of etching properties for the n+Poly-Si film 13 on the power of each of the lateral electrodes 2A, 2B, and 2C. The increase in etching rate is roughly proportional to the increase in electric power with only 1 to 5% deviation from expected values. The selectivity of 250 (to a thermal oxide film) was obtained at the etching rate of 600 nm/min, which was satisfactory.

The results show that excellent etching properties, such as uniform etching, high etching rate, high selectivity and vertical etch profile, were obtained for the n+Poly-Si film 13 with lower electric power than that required by a conventional dry-etching apparatus without using a depositing gas such as HBr and without applying a magnetic field.

Figure 9A:
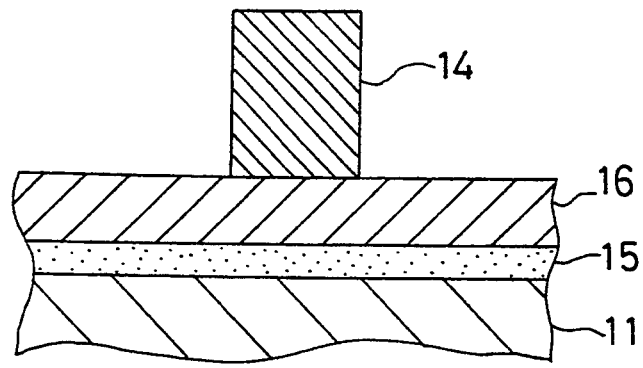
FIGS. 9(a) and 9(b) show an aluminum-silicon film which is etched by using the dry-etching apparatus according to the foregoing first embodiment.
Figure 9B:
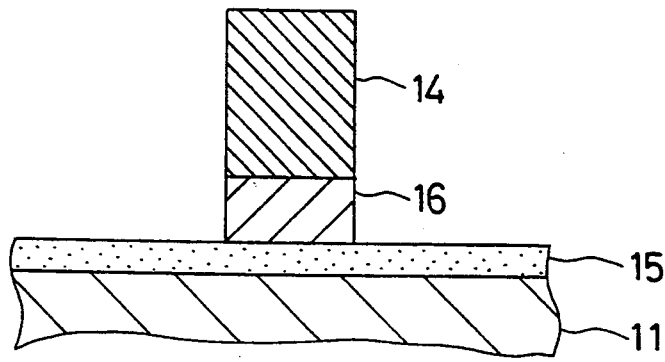

Next, etching for an aluminum-silicon film will be described with reference to FIG. 9. The film structure is shown in FIG. 9(a), in which a BPSG film 15, an Al—Si(1%)-Cu(0.5%) film 16, and a resist 14 are successively formed on silicon substrate 11. The etching conditions are as follows: the flow rates of $BCl_3$ and $Cl_2$, each serving as the etchant gas, are 50 sccm and 60 sccm, respectively; the degree of vacuum is 0.5 Pa; the frequency of the high-frequency electric power to be applied to each of the lateral electrodes 2A, 2B, and 2C is 200 MHz; the high-frequency electric power to be applied to each of the lateral electrodes 2A, 2B, and 2C is 100 W; the frequency of the high-frequency power to be applied to the sample stage 4 is 2 MNz; and the high-frequency electric power to be applied to the sample stage 4 is 50 W. Dry etching was conducted under the optimum conditions mentioned above, with the result that the vertical etch profile was satisfactorily obtained, as shown in FIG. 9(b).

FIG. 10 shows the dependence of etching properties for the Al—Si(1%)-Cu(0.5 %) film 16 on the $N_2$ gas flow rate. As shown in the drawing, the selectivity of 5 (to the resist) was obtained when the etching rate was 600 nm/min under the condition where the Al—Si(1%)-Cu(0.5%) film 16 presented a trapezoidal etch profile, which was satisfactory. As for the proportional increase of the etching rate, its deviation from expected values was within the range of 1 to 5% under all the conditions.

The results show that excellent etching properties for the Al—Si(1%)-Cu(0.5%) film 16 were obtained with lower electric power than required by a conventional dry-etching device without using a depositing gas such as $CHCl_3$ or HBr and without applying a magnetic field.

Figure 11A:
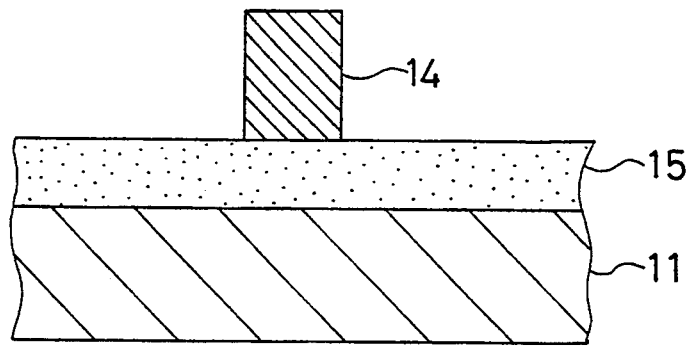
FIGS. 11(a) and 11(b) show a BPSG film which is etched by using the dry-etching apparatus according to the foregoing first embodiment.
Figure 11B:
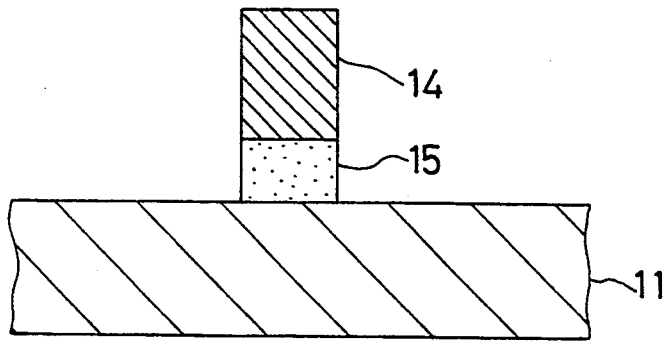

Next, etching for the BPSG film (a silicon-dioxide film containing boron and phosphorus) 15 will be described with reference to FIG. 11. The film structure is shown in FIG. 11(a), in which the BPSG film 15 and a resist 14 are successively formed on a silicon substrate 11. Etching was conducted under the conditions as follows: the flow rates of $CF_4$ and $CH_2F_2$, each serving as the etchant gas, were 50 sccm and 20 to 30 sccm, respectively; the degree of vacuum was 0.7 Pa; the frequency of the high-frequency electric power to be applied to the sample stage 4 was 600 kHz; the high-frequency electric power to be applied to the sample stage 4 was 30 to 100 W; the frequency of the high-frequency electric power to be applied to each of the lateral electrodes 2A, 2B, and 2C was 30 MHz; and the high-frequency electric power to be applied to each of the lateral electrodes 2A, 2B, and 2C was varied. As a result, the vertical etch profile was satisfactorily obtained, as shown in FIG. 11(b). The etching rate increased with the increase of the high-frequency electric power. The selectivity of 90 (to silicon) was obtained at the etching rate of 400 nm/min, which was satisfactory. As for proportional increase of the etching rate, its deviation from expected values was within the range of 1 to 5%. A microloading effect, which is a phenomenon that the etching rate decreases with the increase of the aspect ratio, was not observed when the aspect ratio was 5 or less. Furthermore, a charge-up damage detection was conducted by using a MOSTEG, with the result that damage was not detected for a gate oxide film with the thickness of 10 nm. This is because the plasma was satisfactorily uniform.

The results show that, compared with a conventional dry-etching device, excellent etching properties, which are free from the microloading effect and damage, were obtained for the BPSG film 15.

Figure 12:
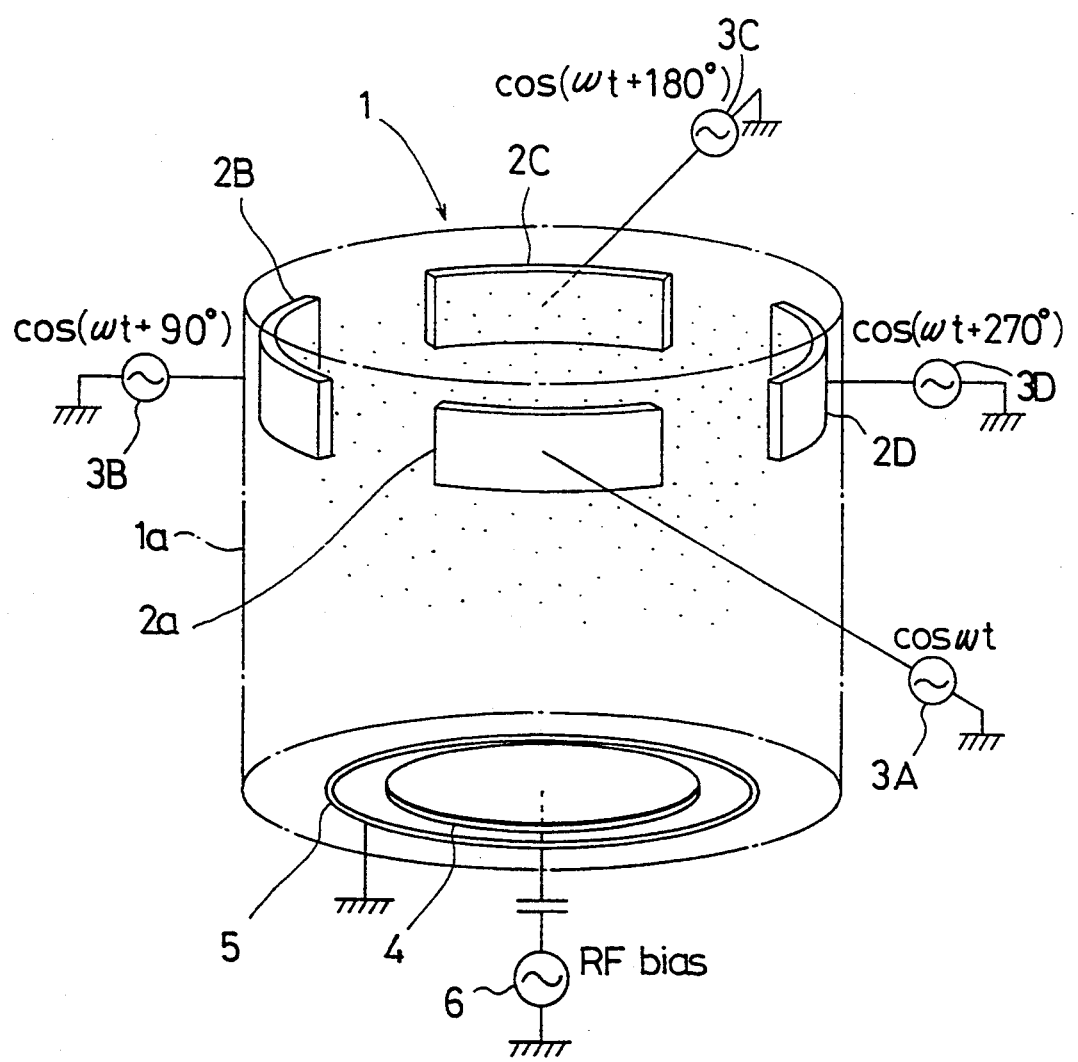
FIG. 12 is a view diagrammatically showing a dry-etching apparatus as a second embodiment of the plasma generating apparatus according to the present invention.
Figure 13:
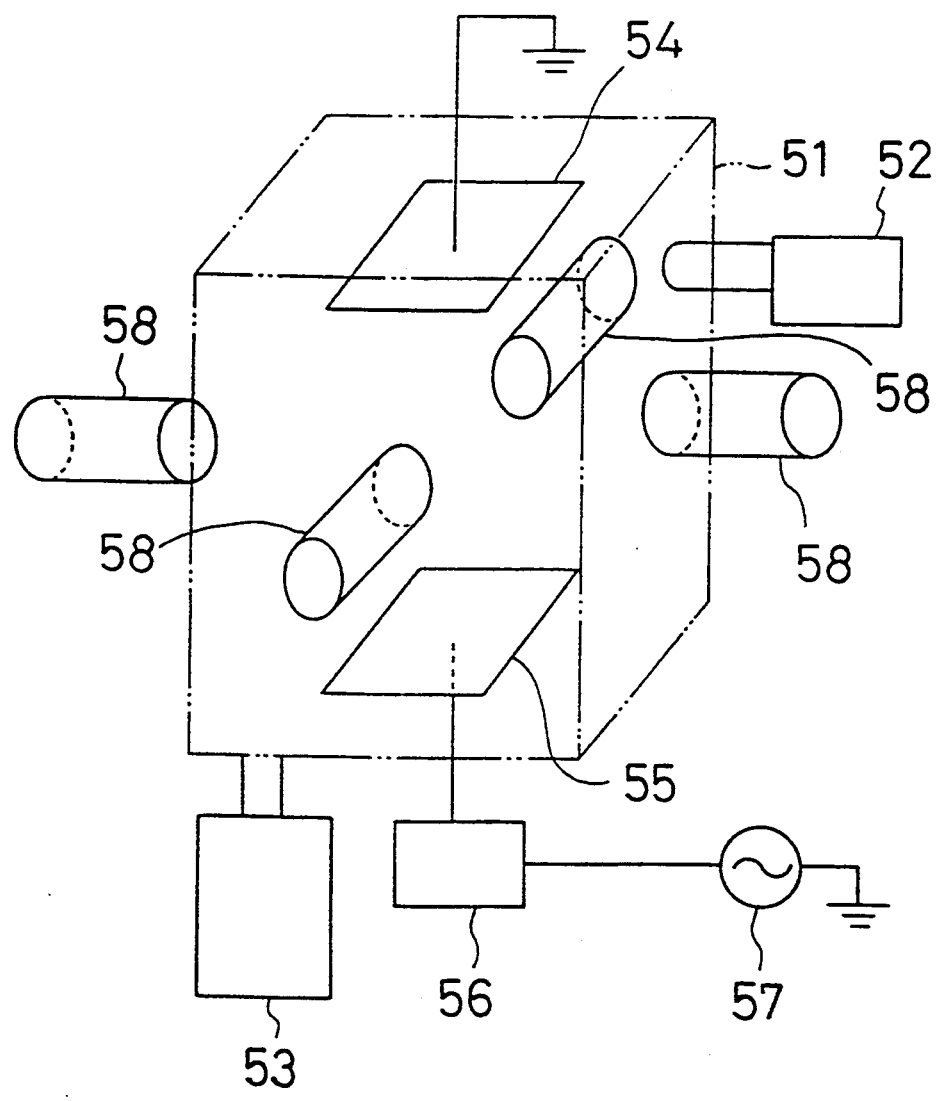
FIG. 13 is a view diagrammatically showing a dry-etching apparatus as the conventional plasma generating apparatus.
Figure 14A:
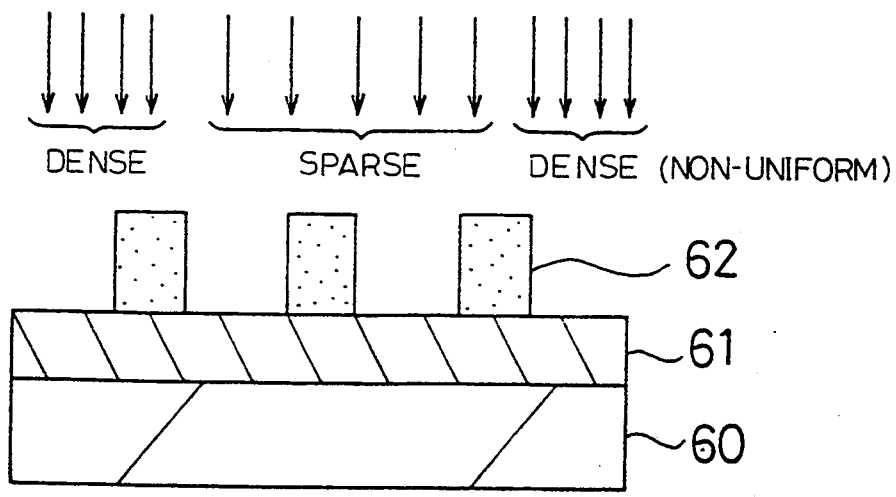
FIG. 14(a) shows boron phosphorus glass etched by using the conventional dry-etching apparatus.
Figure 14B:
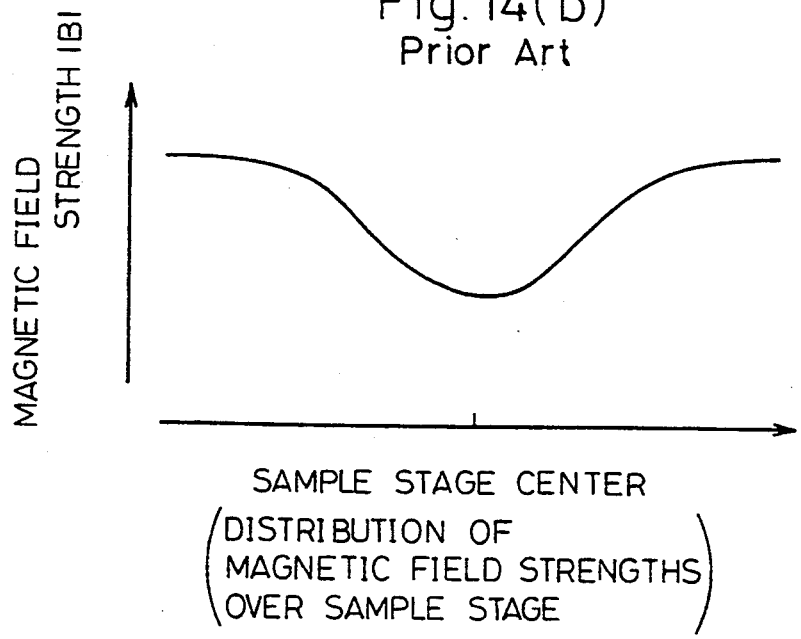
FIG. 14(b) shows the distribution of a magnetic field over the sample stage when the foregoing dry etching is performed.

FIG. 12 shows the structure of a dry-etching apparatus as a second embodiment of the plasma generating apparatus according to the present invention, wherein N is 4.

As for the similar elements to those used in the first embodiment, the detailed description thereof will be omitted by providing the same reference numerals as used in the first embodiment. The inner surface 1a of the chamber 1 is provided with four lateral electrodes 2A, 2B, 2C, and 2D as first electrodes, which are circumferentially placed at roughly regular intervals so that each lateral electrode and its adjacent interval occupy an angular position of 90°. To the lateral electrodes 2A, 2B, 2C, and 2D are applied high-frequency electric powers from the first high-frequency power supplies 3A, 3B, 3C, and 3D, respectively. Each of the high-frequency powers has the same discharging power, but differs in phase by 90°. That is, the phase of the lateral electrode 2B is 90° ahead of that of the lateral electrode 2A, the phase of the lateral electrode 2C is 180 ° ahead of that of the lateral 2A, and the phase of the lateral electrode 2D is 270° ahead of that of the lateral electrode 2A. To each of the lateral electrodes 2A, 2B, 2C, and 2D is applied high-frequency electric power of 30 MHz via a matching circuit (not shown). A phase shift of 90° is realized between each adjacent two of the high-frequency electric powers by a phase shifter (not shown). The positional relationship in terms of height between the lateral electrodes 2A, 2B, 2C, and 2D and the chamber 1 is the same as in the first embodiment.

The sample stage 4 serves as the fifth electrode. Similarly to the first embodiment, the earth electrode 5 is placed around the sample stage 4 with the radial spacing of 30 mm therebetween.

Also similarly to the first embodiment, the etching gas is introduced into the chamber 1 via the gas-flow controller (not shown) and the pressure in the chamber 1 is controlled at 0.1 to 10 Pa by the turbopump (not shown).

Although N was 3 in the first embodiment and N was 4 in the second embodiment, N can be any integer not less than 2 according to the present invention.

Although the etching apparatuses were shown as the first and second embodiments of the plasma generating apparatus, it goes without saying that the plasma generating apparatus according to the present invention is applicable to any apparatus that requires a highly dense plasma under high vacuum such as an ionic source for a plasma CVD apparatus or for a sputtering ion implantation apparatus.

Although the first and second embodiments showed the case where the phase shift between the high-frequency electric powers is fixed at 120° or 90°, it is also possible to change the phase shift as a function of time.

We claim:

1. A plasma generating apparatus comprising:
   a vacuum chamber;
   plasma generating means including N first electrodes (N is an integer not less than 2) disposed at roughly regular intervals in said vacuum chamber and a first high-frequency power supply for supplying said first electrodes in the order of their arrangement with high-frequency electric powers, each of which has a first frequency but differs in phase by (360/N) degrees, so as generate, by means of a rotating electric field formed by said first electrodes, a highly dense plasma in a plasma generating part surrounded by said first electrodes; and
   ion extracting means including a second electrode, an earth electrode, both of which are disposed in said vacuum chamber, and a second high-frequency power supply for supplying said second electrode with high-frequency electric power having a second frequency so as to extract ions from the plasma which has been generated in said plasma generating part,
   said earth electrode being placed in such a position that an electric field formed between said earth electrode and said second electrode does not interfere with the rotating electric field formed by said first electrodes.

2. A plasma generating apparatus according to claim 1, wherein said first electrodes are placed on the lateral part of said vacuum chamber and said second electrode is placed on the bottom of said vacuum chamber.

3. A plasma generating apparatus according to claim 2, wherein said earth electrode is formed in the shape of a ring and provided around said second electrode.

4. A plasma generating apparatus according to claim 1, wherein the distance between each of said first electrodes and said earth electrode is longer than the distance between said second electrode and said earth electrode.

5. A plasma generating apparatus according to claim 1, wherein the first frequency of the high-frequency electric powers applied to said first electrodes is set higher than the second frequency of the high-frequency electric power applied to said second electrode.

6. A plasma generating apparatus according to claim 1, wherein the inner surface of said vacuum chamber is insulated.

7. A plasma generating apparatus according to claim 1, wherein the surfaces of said first electrodes are covered with insulating protective films for preventing sputter deposition on said first electrodes.

8. A plasma generating apparatus according to claim 1, wherein the pressure in said vacuum chamber is set at 10 Pa or less.

* * * * *